United States Patent
Kraft

(10) Patent No.: US 8,278,705 B2
(45) Date of Patent: Oct. 2, 2012

(54) FIELD EFFECT TRANSISTOR WITH GATED AND NON-GATED TRENCHES

(75) Inventor: Nathan Kraft, Pottsville, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 13/152,041

(22) Filed: Jun. 2, 2011

(65) Prior Publication Data

US 2011/0303975 A1    Dec. 15, 2011

Related U.S. Application Data

(63) Continuation of application No. 12/822,008, filed on Jun. 23, 2010, now Pat. No. 7,955,920, which is a continuation of application No. 12/582,487, filed on Oct. 20, 2009, now Pat. No. 7,767,524, which is a continuation of application No. 12/418,949, filed on Apr. 6, 2009, now Pat. No. 7,625,799, which is a continuation of application No. 12/125,242, filed on May 22, 2008, now Pat. No. 7,514,322, which is a continuation of application No. 11/450,903, filed on Jun. 8, 2006, now Pat. No. 7,393,749.

(60) Provisional application No. 60/689,229, filed on Jun. 10, 2005.

(51) Int. Cl.
*H01L 29/76*    (2006.01)

(52) U.S. Cl. ........ 257/330; 257/331; 257/332; 257/333; 257/E29.257; 438/259; 438/270

(58) Field of Classification Search ................. 257/330, 257/331, 332, 333, E29.257; 438/257, 270
See application file for complete search history.

(56) References Cited

U.S. PATENT DOCUMENTS

| 4,893,160 A | 1/1990 | Blanchard |
| 4,941,026 A | 7/1990 | Temple |
| 4,954,854 A | 9/1990 | Dhong et al. |
| 5,126,807 A | 6/1992 | Baba et al. |
| 5,998,822 A | 12/1999 | Wada |
| 6,174,773 B1 | 1/2001 | Fujishima |
| 6,337,499 B1 | 1/2002 | Werner |
| 6,376,878 B1 | 4/2002 | Kocon |

(Continued)

FOREIGN PATENT DOCUMENTS

AT    504290 A2    4/2008

(Continued)

OTHER PUBLICATIONS

Notice of Allowance for U.S. Appl. No. 11/450,903, mailed on Apr. 4, 2008, 9 pages.

(Continued)

*Primary Examiner* — Thanh V Pham

(57) ABSTRACT

A field effect transistor includes a plurality of trenches extending into a semiconductor region of a first conductivity type. The plurality of trenches includes a plurality of gated trenches and a plurality of non-gated trenches. A body region of a second conductivity extends in the semiconductor region between adjacent trenches. A dielectric material fills a bottom portion of each of the gated and non-gated trenches. A gate electrode is disposed in each gated trench. A conductive material of the second conductivity type is disposed in each non-gated trench such that the conductive material and contacts corresponding body regions along sidewalls of the non-gated trench.

8 Claims, 9 Drawing Sheets

U.S. PATENT DOCUMENTS

| | | |
|---|---|---|
| 6,586,800 B2 | 7/2003 | Brown |
| 6,683,346 B2 | 1/2004 | Zeng |
| 6,690,062 B2 | 2/2004 | Henninger et al. |
| 6,750,508 B2 | 6/2004 | Omura et al. |
| 6,803,626 B2 | 10/2004 | Sapp et al. |
| 7,052,982 B2 | 5/2006 | Hshieh |
| 7,064,385 B2 | 6/2006 | Dudek |
| 7,118,988 B2 * | 10/2006 | Buerger et al. ............. 438/437 |
| 7,250,343 B2 | 7/2007 | Kotek |
| 7,345,342 B2 * | 3/2008 | Challa et al. ............. 257/341 |
| 7,393,749 B2 | 7/2008 | Yilmaz et al. |
| 7,504,303 B2 | 3/2009 | Yilmaz |
| 7,514,322 B2 | 4/2009 | Yilmaz et al. |
| 7,625,779 B2 | 12/2009 | Takahashi |
| 7,625,799 B2 | 12/2009 | Yilmaz et al. |
| 2005/0062105 A1 | 3/2005 | Nakamura et al. |
| 2005/0215027 A1 | 9/2005 | Williams et al. |
| 2006/0180855 A1 | 8/2006 | Bhalla et al. |
| 2006/0267088 A1 | 11/2006 | Sharp et al. |
| 2006/0273380 A1 | 12/2006 | Hshieh |
| 2006/0273386 A1 | 12/2006 | Yilmaz |
| 2008/0135925 A1 | 6/2008 | Takemori et al. |

FOREIGN PATENT DOCUMENTS

| | | |
|---|---|---|
| DE | 112006001516 T5 | 4/2008 |
| JP | 2008/546216 T | 12/2008 |
| WO | WO01/88997 A2 | 11/2001 |
| WO | WO2006/135746 A2 | 12/2006 |

OTHER PUBLICATIONS

Notice of Allowance for U.S. Appl. No. 12/125,242, Sep. 19, 2008, 6 pages.

Notice of Allowance for U.S. Appl. No. 12/125,242, Nov. 28, 2008, 8 pages.

Notice of Allowance for U.S. Appl. No. 12/418,949, mailed on on Aug. 7, 2009, 10 pages.

Notice of Allowance for U.S. Appl. No. 12/582,487, mailed on Mar. 23, 2010, 9 pages.

Notice of Allowance for U.S. Appl. No. 12/822,008, mailed on Oct. 18, 2010.

Notice of Allowance for U.S. Appl. No. 12/822,008, mailed on Jan. 31, 2011.

* cited by examiner

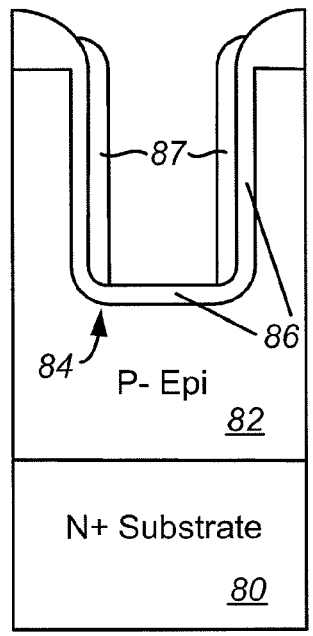 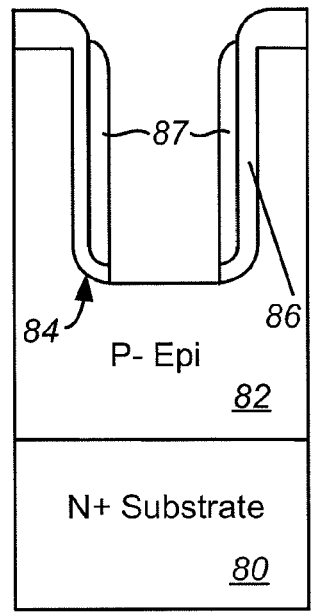
FIG. 2A  FIG. 2B
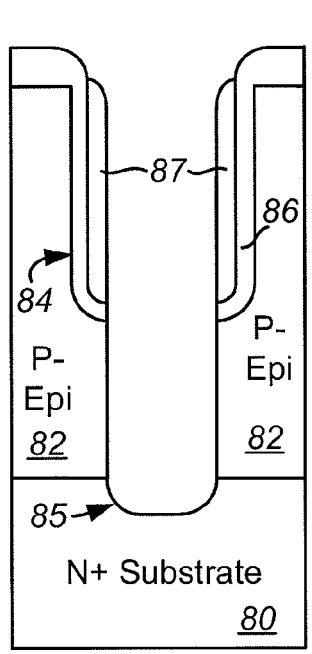 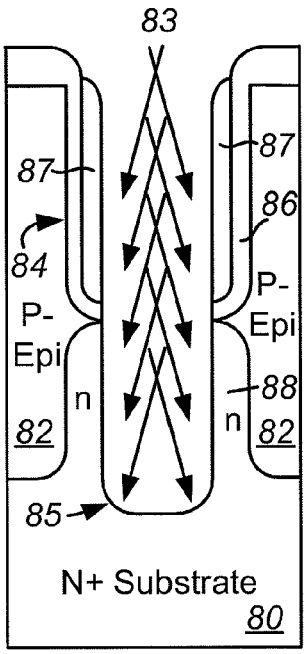 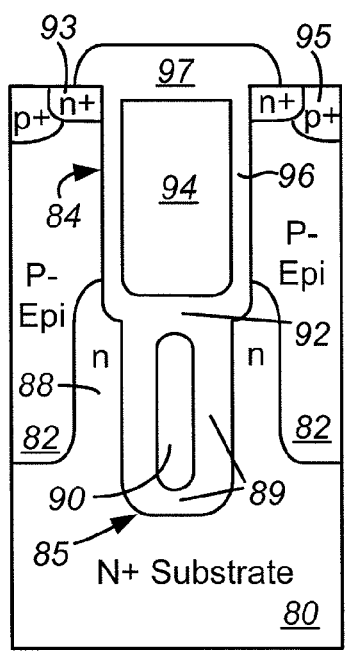
FIG. 2C  FIG. 2D  FIG. 2E

FIELD EFFECT TRANSISTOR WITH GATED AND NON-GATED TRENCHES

CROSS-REFERENCE TO RELATED APPLICATIONS

This application is a continuation of U.S. application Ser. No. 12/822,008, filed Jun. 23, 2010, now U.S. Pat. No. 7,955,920, which is a continuation of U.S. application Ser. No. 12/582,487, filed Oct. 20, 2009, now U.S. Pat. No. 7,767,524, which is a continuation of U.S. application No. 12/418,949, filed Apr. 6, 2009, now U.S. Pat. No. 7,625,799, which is a continuation of U.S. application Ser. No. 12/125,242, filed May 22, 2008, now U.S. Pat. No. 7,514,322, which is a continuation of U.S. application Ser No. 11/450,903, filed Jun. 8, 2006, now U.S. Pat. No. 7,393,749, which claims the benefit of U.S. Provisional Application No. 60/689,229, filed Jun. 10, 2005, all of which are incorporated herein by reference in their entirety for all purposes.

This application relates to U.S. patent application Ser. No. 11/026,276, filed Dec. 29, 2004, and U.S. patent application Ser. No. 11/441,386, filed on May 24, 2006, both of which are incorporated by reference in their entirety for all purposes.

BACKGROUND

The invention relates to semiconductor power device technology, and more particularly to charge balance field effect transistors and methods of manufacturing same.

The development of device structures for high current switches has seen progress from planar gate vertical DMOS to trench gate structures including those with shield electrodes. Early development projects focused on reducing the specific on-state resistance, $R_{SP}$. Later, other performance attributes such as gate charge (the charge required to turn the device on and off) were added to the development objectives. More recently, these merit features have evolved into specific unique objectives depending on the specific application for the switch.

Because of its influence on the switching speed of the MOSFET, the product of the specific on-resistance and the gate-drain charge, $R_{SP} \times Q_{GD}$, is referred to as the figure-of-merit (FOM) for the top switch in synchronous buck converters which are ubiquitous in many electronic systems. In like fashion, the low side MOSFET whose power dissipation depends on conduction losses, is judged based on a FOM depending on the total gate charge, $R_{SP} \times Q_G$. Shielded gate structures can significantly improve both of these figures-of-merit. In addition, by increasing the depth of the shield electrode, charge balance can be improved which allows higher than parallel plane breakdown for a given drift region concentration, thus reducing $R_{SP}$.

Implementing such a charge balance device structure for low voltage MOSFET has proved difficult because of process and material variations resulting in an imbalance in the carrier types which in turn cause reduced breakdown voltage. Assuming charge balance results in a flat electric field in the drift region, it can be shown that the product of the doping concentration N, and the width of the drift region columns W, must be less than the product of the semiconductor permittivity and the critical electric field divided by the electron charge q:

$$N \cdot W < \frac{\varepsilon_S \cdot E_C}{q}$$

Consequently, a lower $BV_{DSS}$ target requires greater doping concentration so that the drift region column width must decrease to maintain charge balance. For example, a 30V device with about $2 \times 10^{16}$ cm$^{-3}$ drift region concentration requires a mesa width less that about 1.4 μm for optimum charge balance. This condition however does not result in an improvement in the $R_{SP}$ since $2 \times 10^{16}$ cm$^{-3}$ can support 30V without charge balance. If the concentration is doubled to reduce drift region resistance, the required mesa width is halved to about 0.7 μm. These fine dimensions are difficult to achieve considering all the features that must fit within the cell architecture such as the heavy body junction needed for avalanche ruggedness.

In most charge balance architectures, the drift region is an n-type region on a heavily doped n-type substrate. In some variations, the trench sidewalls are implanted with boron to provide opposite polarity charge. For low voltage devices, each of these methods may suffer from process variations that result in charge imbalance and a relatively wide distribution in the performance features including $R_{SP}$, $Q_{GD}$, and $BV_{DSS}$. The process variations come from several sources including epitaxial layer concentration, gate electrode depth relative to the p-well depth, mesa width, and shield dielectric thickness.

Thus there is a need for improved charge balance MOSFET cell structures and methods of manufacture.

BRIEF SUMMARY

In accordance with an embodiment of the invention, a field effect transistor is formed as follows. A semiconductor region of a first conductivity type with an epitaxial layer of a second conductivity extending over the semiconductor region is provided. A trench extending through the epitaxial layer and terminating in the semiconductor region is formed. A two-pass angled implant of dopants of the first conductivity type is carried out to thereby form a region of first conductivity type along the trench sidewalls. A threshold voltage adjust implant of dopants of the second conductivity type is carried out to thereby convert a conductivity type of a portion of the region of first conductivity type extending along upper sidewalls of the trench to the second conductivity type. Source regions of the first conductivity type flanking each side of the trench are formed.

In accordance with another embodiment of the invention, a MOSFET includes a trench extending into a semiconductor region and a shield electrode in a lower portion of the trench. The shield electrode is insulated from the semiconductor region by a shield dielectric. A gate electrode is in an upper portion of the trench over but insulated from the shield electrode. The semiconductor region includes a substrate of a first conductivity type and a first silicon region of a second conductivity type over the substrate. The first silicon region has a first portion extending to a depth intermediate a top surface and a bottom surface of the gate electrode. The first silicon region has a second portion extending to a depth intermediate a top surface and a bottom surface of the shield electrode. The semiconductor region further includes a second silicon region of the first conductivity type between the trench and the second portion of the first silicon region. The second silicon region has a laterally-graded doping concentration decreasing in a direction away from the trench sidewalls. The semiconductor region also includes a source region of the first conductivity type in the first silicon region adjacent the trench.

In accordance with another embodiment of the invention, a FET is formed as follows. A semiconductor region of a first conductivity type with an epitaxial layer of a second conductivity extending over the semiconductor region is provided. A first silicon etch is performed to form an upper trench portion extending into and terminating within the epitaxial layer. A protective material is formed extending along sidewalls of the upper trench portion and over mesa regions adjacent the upper trench portion but not along a bottom surface of the upper trench portion. A second silicon etch is performed to form a lower trench portion extending from the bottom surface of the upper trench portion through the epitaxial layer and terminating within the semiconductor region. The lower trench portion is narrower than the upper trench portion. A two-pass angled implant of dopants of the first conductivity type is performed to form a silicon region of first conductivity type along sidewalls of the lower trench portion. The protective material blocks the implant dopants from entering the sidewalls of the upper trench portion and the mesa region adjacent the upper trench portion.

In accordance with yet another embodiment of the invention, a MOSFET includes a trench extending into a semiconductor region. The trench has a lower portion and an upper portion, the lower portion being narrower than the upper portion. The MOSFET further includes a shield electrode in the lower portion of the trench, the shield electrode being insulated from the semiconductor region by a shield dielectric. A gate electrode is in the upper portion of the trench, the gate electrode being over but insulated from the shield electrode. The semiconductor region includes a substrate of a first conductivity type and a first silicon region of a second conductivity type over the substrate. The first silicon region has a first portion extending to a depth intermediate a top surface and a bottom surface of the gate electrode. The first silicon region has a second portion extending to a depth intermediate a top surface and a bottom surface of the shield electrode. The semiconductor region further includes a second silicon region of the first conductivity type between the lower trench portion and the second portion of the first silicon region. The second silicon region has a laterally-graded doping concentration decreasing in a direction away from the sidewalls of the lower trench portion. A source region of the first conductivity type is in the first silicon region, the source region being adjacent the upper trench portion.

In accordance with another embodiment of the invention, a MOSFET is formed as follows. A substrate of a first conductivity type with an epitaxial layer of a first conductivity extending over the substrate is provided. A first silicon etch is performed to form an upper trench portion extending into and terminating within the epitaxial layer. A protective material is formed extending along sidewalls of the upper trench portion and over mesa regions adjacent the upper trench portion but not along a bottom surface of the upper trench portion. A second silicon etch is performed to form a lower trench portion extending from the bottom surface of the upper trench portion through the epitaxial layer and terminating within the substrate, the lower trench portion being narrower than the upper trench portion. A two-pass angled implant of dopants of the first conductivity type is carried out to form a silicon region of first conductivity type along sidewalls of the lower trench portion, the protective material blocking the implant dopants from entering the sidewalls of the upper trench portion and the mesa region adjacent the upper trench portion. A shield dielectric lining sidewalls and bottom surface of the lower trench portion I formed. A shield electrode is formed in the lower trench portion. A gate dielectric layer is formed along sidewalls of the upper trench portion. A gate electrode is formed in the upper trench portion over but insulated from the shield electrode.

In accordance with another embodiment of the invention, a MOSFET includes a trench extending into a semiconductor region. The trench has a lower portion and an upper portion, the lower portion being narrower than the upper portion. The MOSFET further includes a shield electrode in the lower portion of the trench, the shield electrode being insulated from the semiconductor region by a shield dielectric. A gate electrode is in the upper portion of the trench, the gate electrode being over but insulated from the shield electrode. The semiconductor region includes a substrate of a first conductivity type, an epitaxial layer of the first conductivity type over the substrate, and a body region of a second conductivity type in the epitaxial layer. A source region of the first conductivity type is in the body region, the source region and an interface between the body region and the substrate defining a channel region. A silicon region of the first conductivity type extends along sidewalls of the lower portion of the trench and into a lower portion of the channel region. The silicon region has a laterally-graded doping concentration decreasing in a direction away from the sidewalls of the trench.

In accordance with another embodiment of the invention, a MOSFET is formed as follows. A substrate of a first conductivity type with an epitaxial layer of the first conductivity type extending over the substrate is provided. A gate trench is formed extending through the epitaxial layer and terminating within the substrate. A shield dielectric lining sidewalls and bottom surface of the gate trench is formed. A shield electrode is formed in the gate trench. A gate dielectric layer is formed along upper sidewalls of the gate trench. A gate electrode is formed in the gate trench, the gate electrode being over but insulated from the shield electrode. A deep dimple is formed extending through the epitaxial layer and terminating within the substrate, the deep dimple being laterally spaced from the gate trench. The deep dimple is filled with silicon material of the second conductivity type.

In accordance with another embodiment of the invention, a MOSFET includes a substrate of a first conductivity type and an epitaxial layer of the first conductivity type over the substrate. A gate trench extends through the epitaxial layer and terminates within the substrate. A shield dielectric lines sidewalls and bottom surface of the gate trench. A shield electrode is in a lower portion of the gate trench. A gate dielectric layer extends along upper sidewalls of the gate trench. A gate electrode is in the gate trench, the gate electrode being over but insulated from the shield electrode. A deep dimple extends through the epitaxial layer and terminates within the substrate, the deep dimple being laterally spaced from the gate trench. The deep dimple is filled with silicon material of the second conductivity type.

In accordance with another embodiment of the invention, a MOSFET is formed as follows. A substrate of a first conductivity type is provided. An epitaxial layer of the first conductivity type is formed over the substrate. A plurality of gate trenches extending through the epitaxial layer and terminating within the substrate is formed. A shield dielectric lining sidewalls and bottom surface of each gate trench is formed. A shield electrode is formed in each gate trench. A gate dielectric layer is formed along upper sidewalls of each gate trench. A gate electrode is formed in each gate trench, the gate electrode being over but insulated from the shield electrode. A plurality of ion implantations of dopants of the second conductivity type into mesa regions between adjacent gate trenches are carried out to thereby form a plurality of pillars of second conductivity type extending through the epitaxial layer and terminating within the substrate, each pillar of second conductivity type being located between every two gate trenches.

In accordance with another embodiment of the invention, a FET is formed as follows. A plurality of trenches are formed in a semiconductor region of a first conductivity type, the plurality of trenches including a plurality of gated trenches and a plurality of non-gated trenches. A body region of a second conductivity is formed in the semiconductor region between adjacent trenches. A bottom portion of each of the gated and non-gated trenches is filled with dielectric material. A gate electrode is formed in each gated trench over the dielectric material. A conductive material of the second conductivity type is formed in each non-gated trench over the dielectric material such that the conductive material contacts the body region along sidewalls of each non-gated trench.

In accordance with another embodiment of the invention, a FET is formed as follows. A plurality of trenches are formed in a semiconductor region of a first conductivity type, the plurality of trenches including a plurality of gated trenches and a plurality of non-gated trenches. A shield electrode is formed in a bottom portion of each gated and non-gated trench. A body region of a second conductivity is formed in the semiconductor region between adjacent trenches. A dielectric layer is formed over the shield electrode in each non-gated trench. A conductive material of the second conductivity type is formed in each non-gated trench over the dielectric layer such that the conductive material contacts body regions along sidewalls of the non-gated trench.

In accordance with another embodiment of the invention, a FET is formed as follows. A plurality of trenches are formed in a semiconductor region of a first conductivity type, the plurality of trenches comprising a plurality of gated trenches and a plurality of non-gated trenches. A body region of a second conductivity type is formed in the semiconductor region between adjacent trenches. A shield electrode is formed in a bottom portion of each gated trench. A shield electrode is formed in each non-gated trench, the shield electrode in each non-gated trench having a top surface above a bottom surface of the body region. A conductive material of the second conductivity type is formed in each non-gated trench such that the conductive material contacts body regions along sidewalls of the non-gated trench, the conductive material also being in contact with the shield electrode in each non-gated trench.

In accordance with another embodiment of the invention, a FET is formed as follows. A plurality of trenches are formed in a semiconductor region of a first conductivity type, the plurality of trenches including a plurality of gated trenches and a plurality of non-gated trenches. A shield electrode is formed in a bottom portion of each gated and non-gated trench. A body region of a second conductivity type is formed in the semiconductor region between adjacent trenches. A dielectric layer is formed over the shield electrode in each non-gated trench. A two-pass angled implant of dopants of the second conductivity type into exposed upper sidewalls of each non-gated trench is carried out to thereby form a heavy body region in each body region.

In accordance with another embodiment of the invention, a FET is formed as follows. A plurality of trenches are formed in a semiconductor region of a first conductivity type, the plurality of trenches comprising a plurality of gated trenches and a plurality of non-gated trenches. A body region of a second conductivity is formed in the semiconductor region between adjacent trenches. A bottom portion of each of the gated and non-gated trenches is filled with dielectric material. A gate electrode is formed over the dielectric material in each gated trench. A two-pass angled implant of dopants of the second conductivity type into exposed upper sidewalls of each non-gated trench is carried out to thereby form a heavy body region in each body region.

The following detailed description and the accompanying drawings provide a better understanding of the nature and advantages of the present invention.

BRIEF DESCRIPTION OF THE DRAWINGS

FIGS. 2A-2E are simplified cross section views depicting an exemplary process flow for forming an n-channel charge balance MOSFET using a p-type epitaxial layer according to another embodiment of the present invention;

DETAILED DESCRIPTION

In accordance with an embodiment of the present invention, an n-channel shielded gate MOSFET, which is particularly useful for low voltage applications but not limited thereto, is formed in a p-type epitaxial layer rather than the conventional n-type epitaxial layer. This provides opportunities to simplify the process, such as eliminating the process steps associated with forming the p-type body region.

Figure 1A:
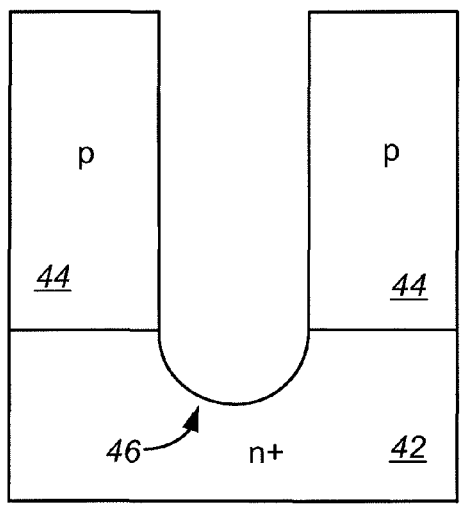
FIGS. 1A-1D are simplified cross section views depicting an exemplary process flow for forming an n-channel charge balance MOSFET using a p-type epitaxial layer according to one embodiment of the present invention.

FIGS. 1A-1D are simplified cross section views illustrating a process sequence for forming a charge balance MOSFET according to an embodiment of the present invention. In FIG. 1A, a p-type epitaxial layer 44 is formed (e.g., by selective epitaxial growth of silicon) over a silicon substrate 42. In one embodiment, the starting wafer material includes substrate 42 and its overlying p-type epitaxial layer 44. A convention trench etch is carried out to form trench 46 extending through epitaxial layer 44 and terminate is substrate 42. An optional anneal step may then be performed to repair damaged silicon and to round the trench corners.

Figure 1B:
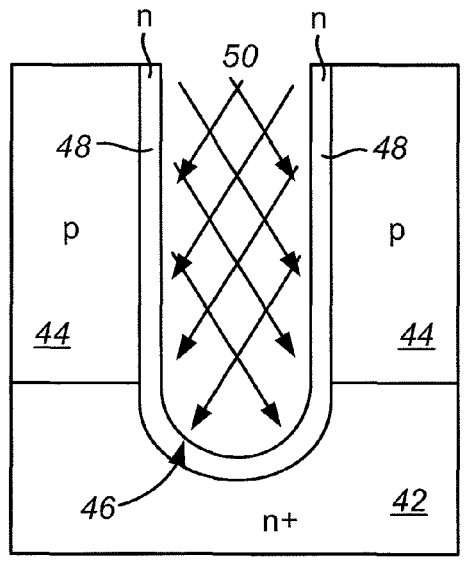
Figure 1C:
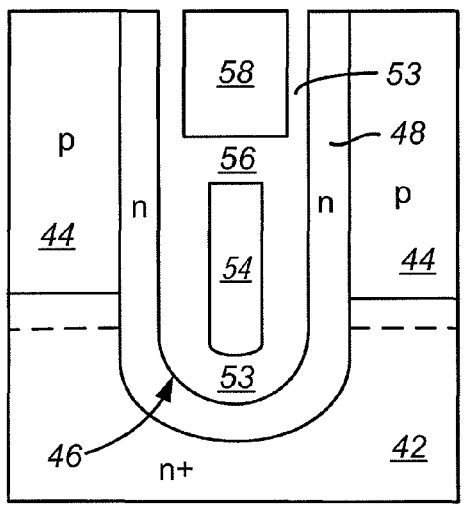

In FIG. 1B, a two-pass angled implant 50 is carried out to form an n-type region 48 along the trench sidewalls and bottom using known techniques. While not shown, the mesa regions are blocked from receiving the implant dopants. An optional diffuse and drive step may be used to drive the implanted ions further into the silicon. In FIG. 1C, a shield dielectric 53 and shield electrode 54 are formed in the lower portion of trench 46 using conventional techniques. An inter-poly dielectric (IPD) layer 56 is then formed over shield electrode 54. Using known methods, a gate dielectric 53 lining the upper trench sidewalls is formed followed by a recessed gate electrode 58 formed over IPD layer 56.

Figure 1D:
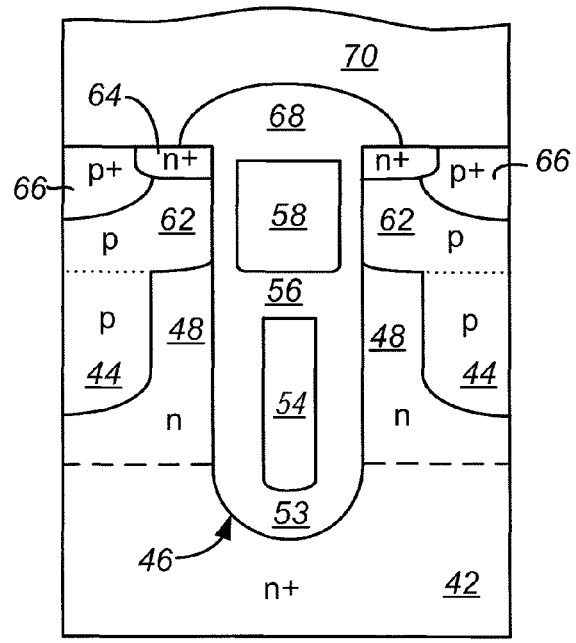

In FIG. 1D, a threshold voltage (Vt) adjust implant of p-type dopants is carried out to form p-type regions 62 using known techniques. The doping concentration of the Vt implant is selected so that the implant counter-dopes the portion of n-type region 48 extending along the channel region, and the desired doping concentration is obtained in the channel region of the transistor. A conventional source implant is then performed to form n+ source regions 64. The thermal budget for the source diffusion also serves to drive in the Vt adjust implant. Heavy body regions 66 are then formed using conventional techniques. As seen in FIG. 1D, a large portion of p-type epitaxial layer 44 still remains p-doped. To complete the device, a dielectric layer 68 such as borophosphosilicate glass (BPSG) is deposited and patterned to cover trench 46 and a portion of source regions 64. A source interconnect layer 70 (e.g., comprising metal) is then formed over the structure to electrically contact source regions 64 and heavy body regions 66.

During the heat cycles associated with the above steps, n-type dopants in both the n-type region 48 and substrate 42 diffuse out. As a result, the doping concentration in the out-diffused n-type region 48 is greatest near the trench and gradually decreases in the direction away from trench sidewalls. Similarly, the out-diffusion of dopants from substrate 42 into epitaxial layer 44 leads to formation of a graded n-type region with a doping concentration which gradually decreases in the direction from the original interface between substrate 42 and epitaxial layer 44 (shown as a dotted line in FIGS. 1C and 1D) toward the top surface. This effectively moves the boundary between substrate 42 and epitaxial layer 44 upwards.

In FIG. 1D, the portion of n-type region 48 extending below the transistor channel regions together with the portions of p-type epitaxial layer 44 directly adjacent these portions of n-type region 48 form columns of a charge balance structure. As can be seen from the process depicted by FIGS. 1A-1D, these p-type and n-type columns of the charge balance structure are advantageously formed in a self-aligned manner. The charge balance structure together with the shielded gate structure reduces both the gate-to-drain charge Qgd and the on-resistance, and increases the breakdown voltage. These improvements are achieved using a simple process wherein the process steps for forming the well region (also referred to as body region) are eliminated. In one embodiment, the conductivity type of the various regions is reversed so that a p-channel MOSFET is obtained. In another embodiment, substrate 42 comprises multiple layers of the same conductivity type silicon with different doping concentrations.

In one variation of the FIGS. 1A-1D embodiment, a very lightly doped p-type epitaxial layer is used, and subsequently, a two-pass angled implant of p-type dopants is carried out to form a p-type region along the trench sidewalls. Next, a two-pass angled implant of n-type dopants is carried out to form a n-type region along trench sidewalls. The doping concentration, implant energy and other implant parameters can be properly selected to ensure that the p-type region laterally extends further than the n-type region, so that the p-type and n-type regions form the two columns of the charge balance structure. Thus, since both the p-type and n-type columns in the charge balance structure are doped using the implantation steps, any charge imbalance resulting from doping variation in the epitaxial layer can be eliminated.

Thus, by carefully optimizing the p-type body and the n-type sidewall implant and drive-in conditions, charge balance and gate overlap of the p-body are greatly enhanced compared to conventional techniques. As a result, lower specific on-state resistance and much lower gate-drain charge are achieved. Simulations of exemplary structures indicate at least 10-20% lower RSP and half the gate-drain charge compared to conventional shielded gate structures.

In an alternate method, a shallow trench is etched and an oxide layer and then a nitride layer are formed to protect the mesa and trench sidewalls from a later deep trench etch. With the nitride remaining on the sidewalls of the shallow trench, the deeper trench sidewalls are exposed for an angled implant. This confines the implant to the lower portions of the epitaxial region and out of the channel region, allowing the p-type epitaxial layer to act as the channel and as the deep junction for charge balance purposes. An exemplary process flow for obtaining such a structure is illustrated in FIGS. 2A-2D.

In FIG. 2A, a p-type epitaxial layer 82 is formed (e.g., by selective epitaxial growth of silicon) over a highly doped n-type substrate 80. A trench 84 is then etched to an intermediate depth within epitaxial layer 82. A first dielectric layer 86 (e.g., comprising oxide) is then formed lining the sidewalls and bottom of trench 84 and extending on top of the silicon mesa adjacent trench 84. As will be seen, it is desirable to form the first dielectric layer 86 such that the portion of the first dielectric layer 86 extending over the silicon mesa is thicker than the portion of the first dielectric layer 86 inside trench 84. One way to obtain a thicker dielectric over the mesa region is to form a composite layer of, for example, ONO, in a similar manner to that depicted in FIGS. 13A-13L of the commonly assigned U.S. patent application Ser. No. 11/441,386, filed on May 24, 2006, which application is incorporated herein by reference in its entirety. Using known techniques, a second dielectric layer (e.g., comprising nitride) is then formed over first dielectric layer 86 and then etched to form dielectric (e.g., nitride) spacers 87.

In FIG. 2B, with dielectric spacers 87 serving as a protective spacers, the exposed portions of the first dielectric layer 86 are etched until epitaxial layer 82 becomes exposed along the trench bottom. Given that the first dielectric layer 86 is formed to have a greater thickness over the mesa region than along the trench bottom, the mesa surface remains covered by the first dielectric layer (albeit thinner) after the etch.

In FIG. 2C, a further silicon etch is carried out whereby the exposed bottom surface of trench 84 is extended clear through epitaxial layer 82 and into substrate 80 to form a deeper trench 85. Trench 85 thus has a narrower lower portion than its upper portion. With the first dielectric layer 86 and dielectric spacers 87 serving to protect the mesa surface and the upper trench sidewalls, a two-pass angled implant 83 of n-type dopants is carried out to form n-type silicon region 88 along the exposed lower sidewalls of trench 85. As shown n-type layer 88 merges with substrate 80. Dielectric spacers 87 prevent the implant from getting into the channel region.

In FIG. 2E, dielectric spacers 87 and first dielectric layer 86 are removed using conventional techniques. A shield dielectric 89 and shield electrode 90 are then formed in the lower portion of trench 85 using conventional techniques. An interpoly dielectric (IPD) layer 92 is formed over shield electrode 90 using known methods. Gate dielectric 96 and gate electrode 94 are then formed over IPD layer 92 using conventional techniques. Source regions 93 and heavy body regions 95 are formed using known techniques. A dielectric layer 97 such as BPSG is then deposited over the top of the structure and patterned to cover gate 94 and a portion of source regions 93, and then a source interconnect layer (not shown) is formed to electrical contact source regions 93 and heavy body regions 95.

Figure 3A:
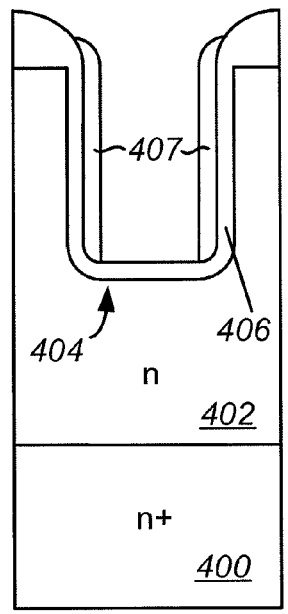
FIGS. 3A-3E are simplified cross section views depicting an exemplary process flow for forming an n-channel charge balance MOSFET using a n-type epitaxial layer according to another embodiment of the present invention.
Figure 3B:
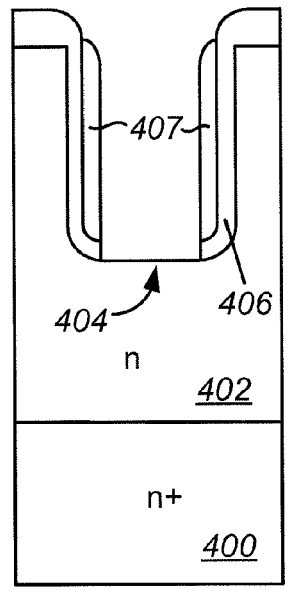
Figure 3C:
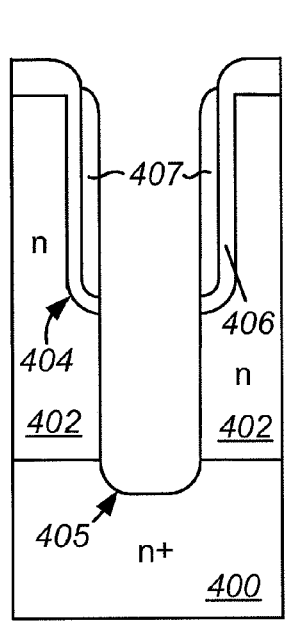
Figure 3D:
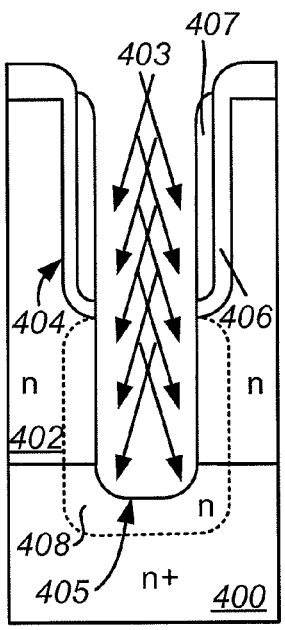
Figure 3E:
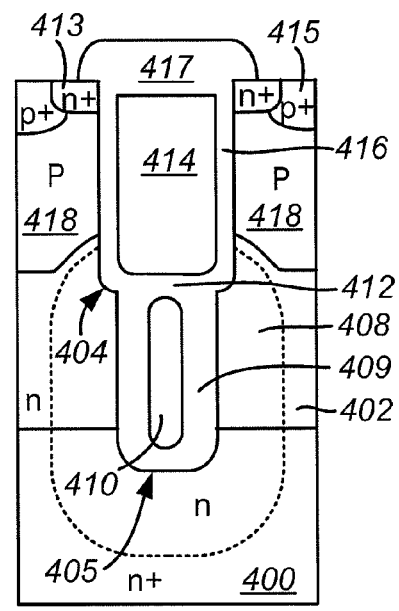

A similar process to that illustrated by FIGS. 2A-2E can be carried out to form a shielded gate structure in an n-type epitaxial layer rather than a p-type epitaxial layer. The two-pass angled implant of n-type dopants suppresses the body diffusion into a bottom portion of the channel region, which advantageously reduces the channel resistance. This implant also helps alleviate the high electric fields seen at the trench sidewall. An exemplary process flow for forming such a structure is depicted by FIGS. 3A-3E. In FIG. 3A, an n-type epitaxial layer 402 is formed over an n-type substrate 400 using, for example, selective epitaxial growth. All subsequent steps leading to the formation of the shielded gate structure in FIG. 3E are similar to corresponding steps in FIGS. 2A-2E except that in FIG. 3E, prior to forming source regions 413 and heavy body regions 415, a body implant of p-type dopants is carried out to form body region 418. As shown by FIGS. 3D and 3E, silicon region 408 formed by the two-pass angled implant diffuses up into the channel region, thus reducing the channel resistance.

Figure 4:
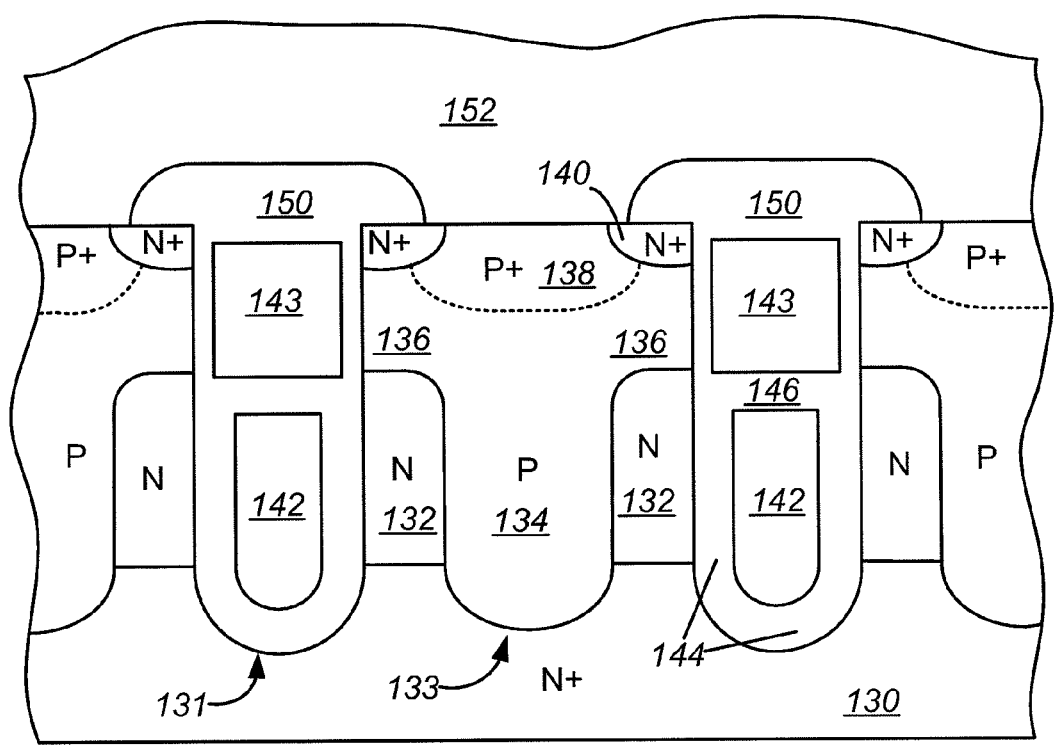
FIG. 4 is a simplified exemplary cross section view showing a charge balance shielded gate MOSFET with a silicon-filled trench according to an embodiment of the present invention.

In accordance with another embodiment of the invention, a charge balance shielded gate MOSFET is formed using a n-type epitaxial layer and a deep dimple that is filled in with epitaxially grown p-type silicon. This embodiment will be described using the exemplary cross section view in FIG. 4. In FIG. 4, between every two adjacent gated trenches 131, a deep dimple 133 extends through body region 136 and n-type epitaxial layer 132 and terminating in the highly doped n-type substrate 130. Dimple 133 is filled with p-type silicon material 134. The doping concentration of n-type epitaxial layer 132 and the silicon material 134 in dimples 133 are selected so that charge balance is obtained between these two regions. The gated trench structure is otherwise similar to those in the previous embodiments, and thus will not be described.

An exemplary method for forming the structure in FIG. 4 is as follows. An n-type epitaxial layer 132 is formed (e.g., by selective epitaxial growth) over highly doped n-type substrate 130. Body regions 136 of p-type conductivity are formed by implanting dopants into epitaxial layer 132. Body regions 136 extend to a depth sufficient to enable formation of channel regions. A subsequent silicon etch is carried out to form deep dimples 133 extending through body regions 136 and terminating in substrate 130. A selective epitaxial growth process is then performed to fill deep dimples 133 with p-type silicon 134. The gate trench 131 and the various materials therein, as well as source regions 140, heavy body regions 138 and other structural features are formed in accordance with known techniques. In one embodiment, the gate trench and the gate and shield electrodes are formed before forming the deep dimples. By extending dimples 133 below the substrate-epitaxial layer interface, the high electric fields at the bottom of the pillars are advantageously relieved. This allows for a thinner n-type epitaxial layer, further reducing the on-state resistance.

Figure 5A:
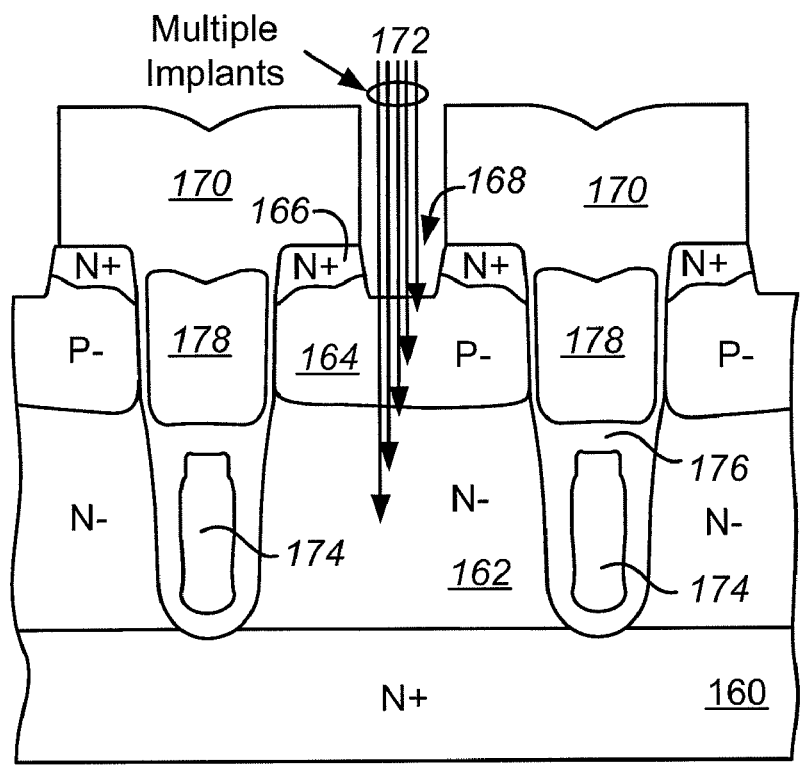
FIGS. 5A-5B are simplified cross section views depicting an exemplary process flow for forming a charge balance MOSFET using multiple ion implantation steps according to an embodiment of the present invention.
Figure 5B:
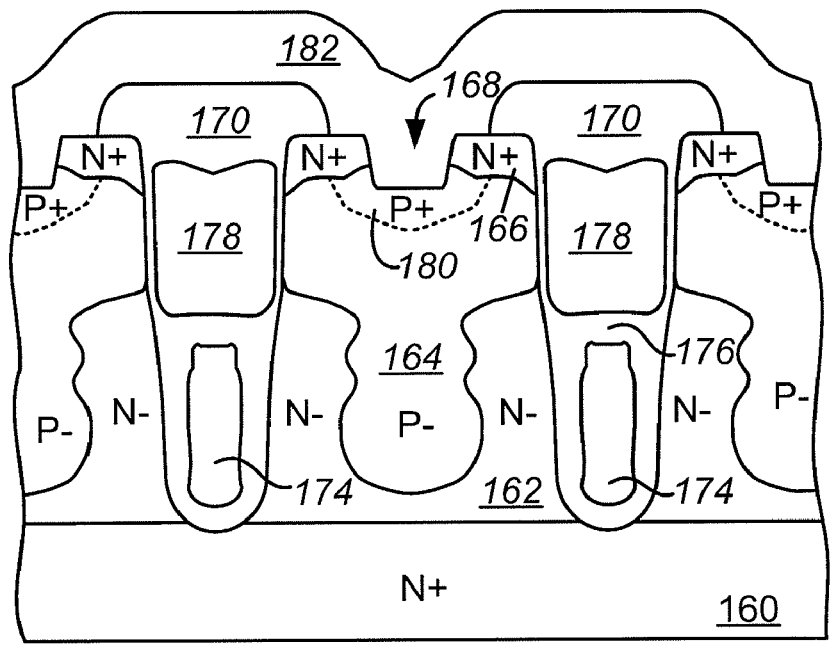

FIGS. 5A and 5B show an alternative method of forming the deep p-type regions 134 in FIG. 4 As shown in FIGS. 5A and 5B, p-type pillars 164 are formed by implanting multiple high energy implants 172 of p-type dopants through a shallow dimple 168 into an n-type epitaxial layer 162. As shown, the dimple depth is slightly deeper than that of source regions 166. The dimple depth sets the reference point for the depth of p-type pillars 164 since implants 172 are into the bottom surface of dimple 168. The dose and energy of the implants 172 can be tuned to obtain the required doping profile in the p-type pillars 164. Since there is very little diffusion at the end of the process, the doping profiles of both the resulting p-type pillars 164 and n-type epitaxial layer 162 are relatively flat. This results in improved process sensitivity.

In accordance with other embodiments of the invention, additional methods and structures for a charge balanced MOSFET (particularly used for low voltage applications though not limited thereto) use non-gated shield trenches between gated trenches. These embodiments are described next.

Charge balance trench gate FETs rely on the mesa width and the doping concentration of the drift region (typically an epitaxial layer) to control the depletion under high reverse drain-source bias in order to obtain a higher breakdown than conventional trench gate FETs. The mesa width is limited by the capabilities of the photolithography to define a continuous heavy body contact region in the center of the mesa between adjacent gate trenches. However, in accordance with an embodiment of the invention, the use of additional non-gated shield trenches interspersed between the gate trenches enables lowering the drift region resistivity for the same breakdown voltage, effectively reducing the on-state of the device and allowing for improved charge balancing properties.

Figure 6A:
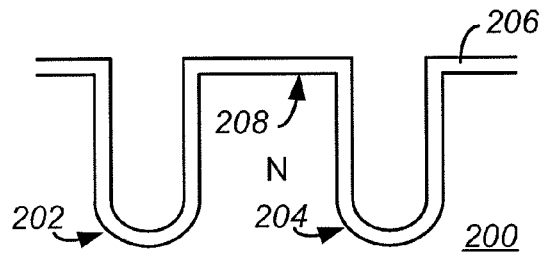
FIGS. 6A-6G are simplified cross section views illustrating an exemplary process flow for forming a trench gate FET with self-aligned non-gated trenches incorporated between the gated trenches, according to an embodiment of the present invention.

FIGS. 6A-6G are simplified cross section views illustrating an exemplary process flow for forming a trench gate FET with self-aligned non-gated trenches incorporated between the gated trenches, according to an embodiment of the present invention. In FIG. 6A, using conventional techniques, trenches 202 and 204 are etched into silicon region 200. In one embodiment, silicon region 200 comprises a highly doped n-type substrate and an n-type epitaxial layer over the substrate.

Figure 6E:
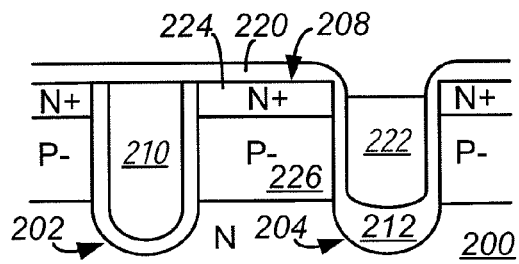
Figure 6B:
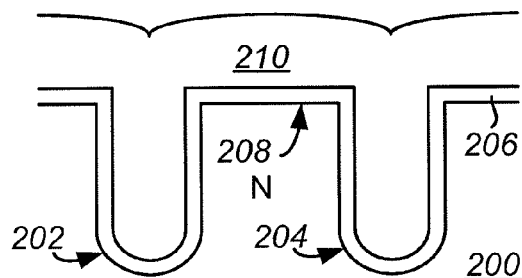

Trench 202 will be referred to as non-gated trench, and trench 204 will be referred to as gated trench. A dielectric layer 206 (e.g., grown oxide) extending over mesa surfaces 208 and lining the sidewalls and bottom surfaces of trenches 202 and 204 is formed using known techniques. In FIG. 6B, a dielectric material 210 (e.g., deposited film such as SACVD) filling the trenches and extending over the mesa regions is deposited, using conventional methods. In FIG. 6C, a planarization process is carried out such that a top surface of the dielectric material 210 remaining in the trenches is substantially co-planar with mesa surfaces 208, using known techniques.

Figure 6F:
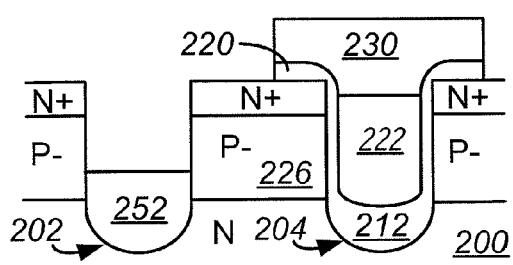
Figure 6C:
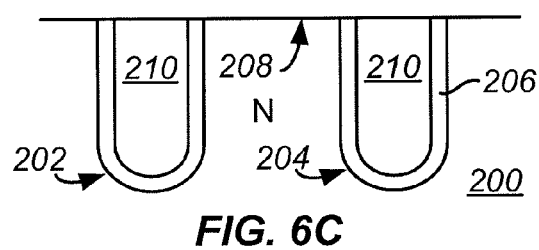
Figure 6G:
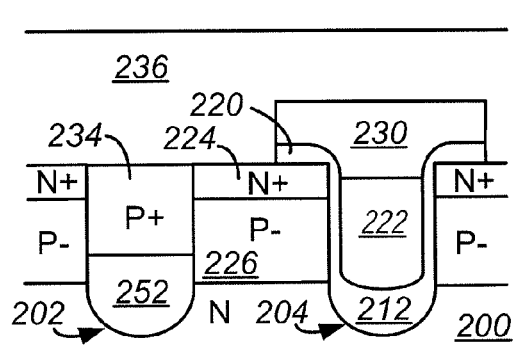
Figure 6D:
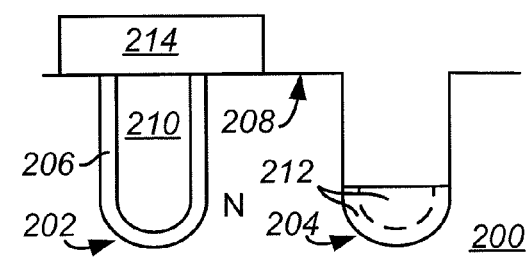

In FIG. 6D, using conventional methods, a masking layer (e.g., photoresist) is deposited and patterned to form masking region 214 covering non-gated trench 202, and then dielectric layer 206 and dielectric material 210 in gated trench 204 are recessed to thereby form thick bottom dielectric (TBD) 212 along the bottom of gated trench 204. In FIG. 6E, masking region 214 is removed and a gate dielectric layer 220 (e.g., comprising oxide) lining sidewalls of gated trench 204 and extending over mesa surfaces and non-gated trench 202 is formed using conventional techniques. A polysilicon layer is then deposited and recessed into gated trench 204 to form recessed gate electrode 222 in gated trench 204. Conventional blanket body and source implantations are carried out in the active region of the device to sequentially form p-type body regions 226 in silicon region 200 and then form highly doped n-type source regions 224 in body regions 226.

In FIG. 6F, using known techniques, a dielectric layer (e.g., comprising BPSG) is formed over the structure and then patterned and etched to form dielectric cap 230 extending only over gated trench 204. The same dielectric etch may be used to recess dielectric materials 206 and 210 in non-gated trench 202 sufficiently to partially expose sidewalls of body regions 226. Dielectric region 252 thus remains along the bottom of non-gated trench 202.

In FIG. 6G, non-gated trench 202 is filled with a conductive material (e.g., highly doped p-type polysilicon) to form heavy body region 234. A source interconnect layer 236 (e.g., comprising metal) is then formed over the structure to contact source regions 224 and heavy body regions 234. In one embodiment, in forming heavy body region 234, the deposited conductive material is recessed into non-gated trench 202 to partially expose sidewalls of source regions 224. This enables source interconnect layer 230 to directly contact sidewalls of source regions 224 thereby reducing source contact resistance.

As can be seen, source regions 224 are self-aligned to the trenches. In one embodiment wherein stripe shaped cell configuration is used, the process sequence depicted by FIGS. 6A-6G results in the formation of continuous heavy body regions 234 which are also self-aligned. These and other self-aligned features of the resulting structure allow for a very tight cell pitch. Also, the masking steps typically required in forming each of the source and heavy body regions are eliminated, thus reducing cost and minimizing process complexity.

In one embodiment, one non-gated trench is formed between every two gated trenches. In another embodiment, a larger ratio of non-gated trenches to gated trenches is used (e.g., two or more non-gated trenches are formed between every two gated trenches) to reduce the gate-drain capacitance. In yet another embodiment, instead of forming the non-gated and gated trenches at the same time, the non-gated trenches are formed at a different stage of the process than the gated trenches. While this results in additional processing steps, this embodiment provides flexibility in optimizing various features of the process and the structure.

Figure 7A:
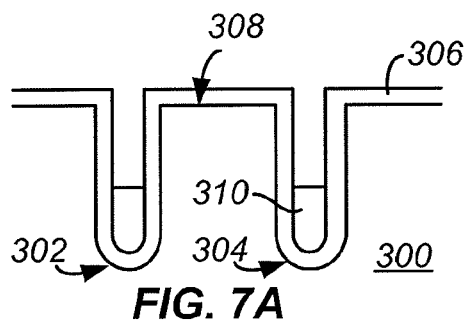
FIGS. 7A-7H are simplified cross section views illustrating another exemplary process flow for forming a shielded gate FET with self-aligned non-gated trenches incorporated between the gated trenches, according to an embodiment of the present invention.

FIGS. 7A-7H are simplified cross section views illustrating another exemplary process flow for forming a shielded gate FET with self-aligned non-gated trenches incorporated between the gated trenches, according to an embodiment of the present invention. In FIG. 7A, gated trench 304 and non-gated trench 302 are etched into n-type silicon region 300. In one embodiment silicon region 300 comprises a highly doped n-type substrate and an n-type epitaxial layer over the substrate. In one variation of this embodiment, trenches 302 and 304 terminate within the epitaxial layer, and in another variation, trenches 320 and 304 extend through the epitaxial layer and terminate within the substrate.

Figure 7E:
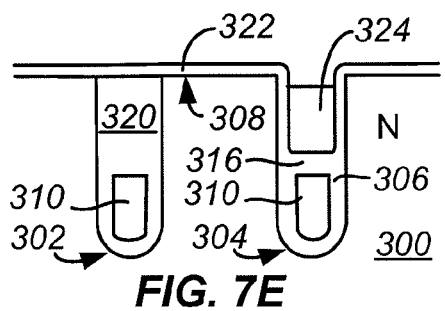
Figure 7B:
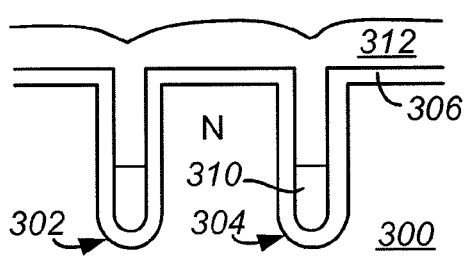
Figure 7F:
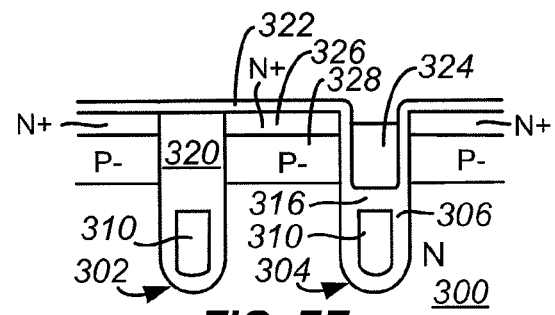
Figure 7C:
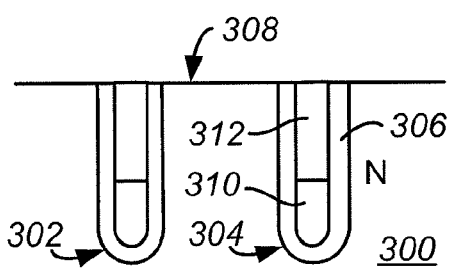

In FIG. 7A, a shield dielectric layer 306 (e.g., comprising oxide) extending over mesa surfaces 308 and lining the sidewalls and bottom surfaces of trenches 302 and 304 is formed using known techniques. A polysilicon layer is deposited and then recessed deep into trenches 302 and 304 to thereby form shield electrodes 310 in trenches 302 and 304 using conventional techniques. In FIG. 7B, a dielectric material 312 (e.g., deposited film using SACVD) filling the trenches and extending over the mesa regions is deposited, using conventional methods. In FIG. 7C, a planarization process is carried out such that a top surface of dielectric material 312 remaining in the trenches is substantially co-planar with mesa surfaces 308, using known techniques.

Figure 7G:
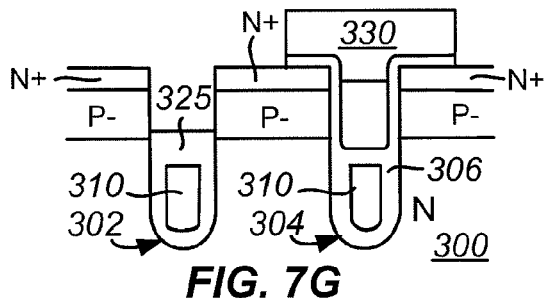
Figure 7D:
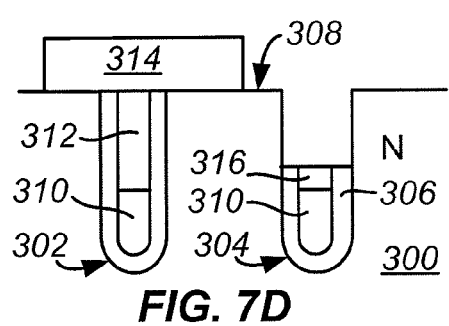

In FIG. 7D, using conventional methods, a masking layer (e.g., photoresist) is deposited and patterned to form masking region 314 covering non-gated trench 302, and then dielectric layer 306 and dielectric material 312 in gated trench 304 are recessed to a predetermined depth to thereby form interelectrode dielectric 316 (IED) over shield electrode 310. In FIG. 7E, masking region 314 is removed and a gate dielectric layer 322 (e.g., comprising oxide) lining upper sidewalls of gated trench 304 and extending over mesa surfaces and non-gated trench 302 is formed using conventional techniques. A polysilicon layer is then deposited and recessed into gated trench 304 to form recessed gate electrode 324 in gated trench 304. In FIG. 7F, conventional blanket body and source implantations are sequentially carried out in the active region of the device to form p-type body regions 328 in silicon region 300 and then form highly doped n-type source regions 326 in body regions 328.

In FIG. 7G, using known techniques, a dielectric layer (e.g., comprising BPSG) is formed over the structure and then patterned and etched to form dielectric cap 330 over gated trench 304. The same dielectric etch may be used to recess dielectric materials 306 and 310 in non-gated trench 302 sufficiently to partially expose sidewalls of body regions 328. Dielectric material 325 thus remains over shield electrode 310 in non-gated trench 302. Non-gated trench 302 is then filled with a conductive material (e.g., highly doped p-type polysilicon) to form heavy body region 332. A source interconnect layer 334 (e.g., comprising metal) is then formed over the structure to contact source regions 326 and heavy body regions 332. In one embodiment, in forming heavy body regions 332, the deposited conductive material is recessed into non-gated trench 302 to partially expose sidewalls of source regions 326. This enables source interconnect layer 334 to directly contact sidewalls of source regions 326 thereby reducing source contact resistance.

As in the preceding embodiment, source regions 326 are self-aligned to the trenches, and in the embodiment wherein stripe shaped cell configuration is used, the process sequence depicted by FIGS. 7A-7H results in the formation of continuous heavy body regions 332 which are also self-aligned. These and other self-aligned features of the resulting structure allow for a very tight cell pitch. Also, the shield electrodes in the non-gated trenches allow the drift region resistivity to be lowered for the same breakdown voltage. Additionally, the masking steps typically required in forming each of the source and heavy body regions are eliminated, thus reducing cost and minimizing process complexity.

The shield electrodes in the gated and non-gated trenches may be electrically connected to the source interconnect layer in a third dimension or may be allowed to float. In one embodiment, one non-gated trench is formed between every two gated trenches. In another embodiment, a larger ratio of non-gated trenches to gated shielded trenches is used (e.g., two or more non-gated trenches are formed between every two gated trenches) to reduce the gate-drain capacitance. In yet another embodiment, instead of forming the non-gated and gated trenches at the same time, the non-gated trenches are formed at a different stage of the process than the gated trenches. While this results in additional processing steps, this embodiment provides flexibility in optimizing various features of the process and the structure.

Figure 8A:
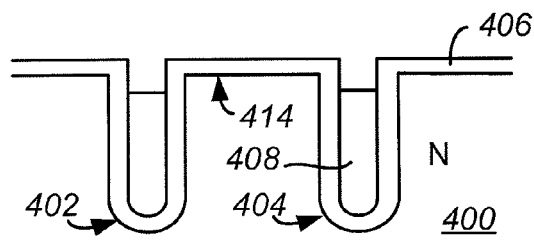
FIGS. 8A-8H are simplified cross section views illustrating yet another exemplary process flow for forming a shielded gate FET with self-aligned non-gated trenches incorporated between the gated trenches, according to another embodiment of the present invention.

FIGS. 8A-8H are simplified cross section views illustrating yet another exemplary process flow for forming a shielded gate FET with self-aligned non-gated trenches incorporated between the gated trenches, according to another embodiment of the present invention. In FIG. 8A, gated trench 404 and non-gated trench 402 are etched into n-type silicon region 400. In one embodiment, silicon region 400 comprises a highly doped n-type substrate and an n-type epitaxial layer over the substrate. In one variation of this embodiment, trenches 402 and 404 terminate within the epitaxial layer, and in another variation, trenches 402 and 404 extend through the epitaxial layer and terminate within the substrate.

Figure 8E:
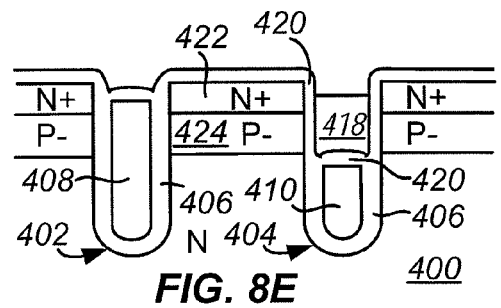
Figure 8B:
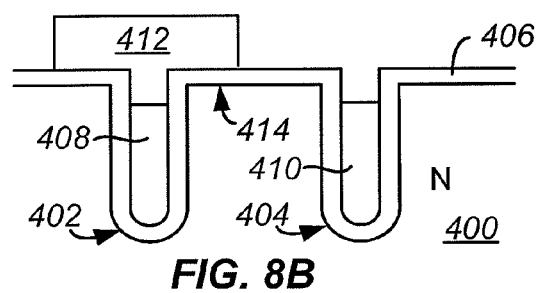

In FIG. 8A, a shield dielectric layer 406 (e.g., comprising oxide) extending over mesa surfaces 414 and lining the sidewalls and bottom surfaces of trenches 402 and 404 is formed using known techniques. A polysilicon layer is deposited and etched back to slightly below the top surface of shield dielectric layer 406, as shown. In FIG. 8B, using conventional methods, a masking layer (e.g., photoresist) is deposited and patterned to form masking region 412 covering non-gated trench 402. In FIG. 8C, polysilicon 410 in gated trench 404 is then recessed deep into the trench thereby forming shield electrode 410 in gated trench 404. Masking region 412 is removed and then shield dielectric layer 406 is etched back as shown.

Figure 8F:
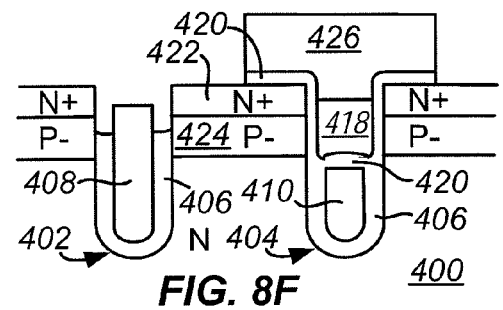
Figure 8C:
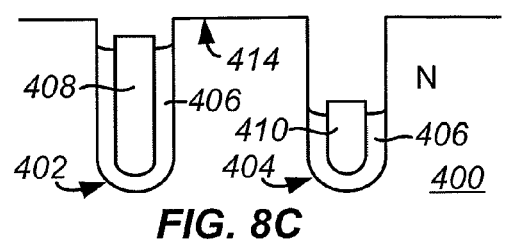
Figure 8G:
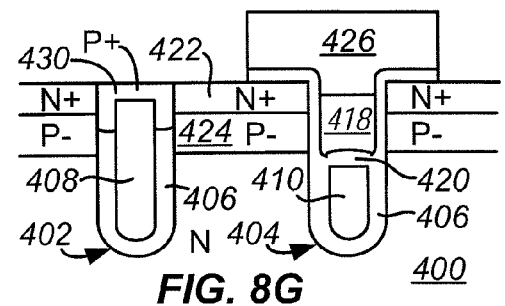
Figure 8D:
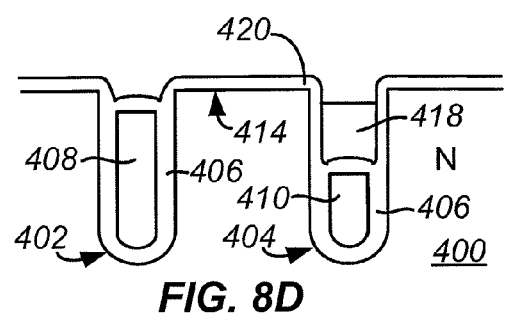

In FIG. 8D, a gate dielectric layer 420 (e.g., comprising oxide) lining upper sidewalls of gated trench 404 and extending over shield electrode 410, the mesa surfaces and non-gated trench 402 is grown using conventional techniques. A polysilicon layer is then deposited and recessed into gated trench 404 to form recessed gate electrode 418 in gated trench 404. In FIG. 8E, conventional blanket body and source implantations are carried out in the active region of the device to form p-type body regions 424 in silicon region 400 and then form highly doped n-type source regions 422 in body regions 424.

Figure 8H:
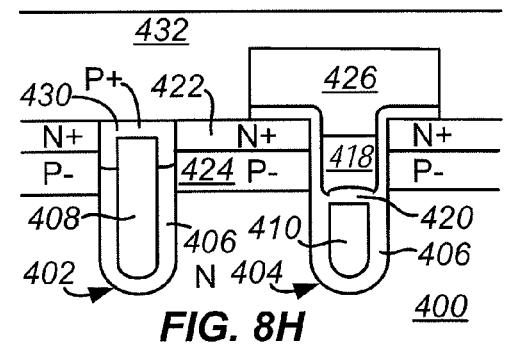

In FIG. 8F, using known techniques, a dielectric layer (e.g., comprising BPSG) is formed over the structure and then patterned and etched to form dielectric cap 426 over gated trench 404. The same dielectric etch may be used to recess shield dielectric 406 in non-gated trench 402 sufficiently to partially expose sidewalls of body regions 424. In FIG. 8G, a conductive material (e.g., highly doped p-type polysilicon) is deposited to fill non-gated trench 402 and then etched back, thus forming heavy body region 430 in non-gated trench 402. In FIG. 8H, a source interconnect layer 432 (e.g., comprising metal) is formed over the structure to contact source regions 422 and heavy body regions 430.

As can be seen, source regions 422 are self-aligned to the trenches. In the embodiment wherein stripe shaped cell configuration is used, the process sequence depicted by FIGS. 8A-8H results in the formation of continuous heavy body regions 430 which are also self-aligned. These and other self-aligned features of the resulting structure allow for a very tight cell pitch. Also, the shield electrodes in the non-gated trenches allow the drift region resistivity to be lowered without degrading the breakdown voltage. Additionally, the masking steps typically required in forming each of the source and heavy body regions are eliminated, thus reducing cost and minimizing process complexity.

As can be seen, shield electrode 408 in non-gated trench 402 is electrically connected to source interconnect 432 via heavy body region 430. In one embodiment, one non-gated trench is formed between every two gated trenches. In another embodiment, a larger ratio of non-gated trenches to gated shielded trenches is used (e.g., two or more non-gated trenches are formed between every two gated trenches) to reduce the gate-drain capacitance. In yet another embodiment, instead of forming the non-gated and gated trenches at the same time, the non-gated trenches are formed at a different stage of the process than the gated trenches. While this results in additional processing steps, this embodiment provides flexibility in optimizing various features of the process and the structure.

Figure 9:
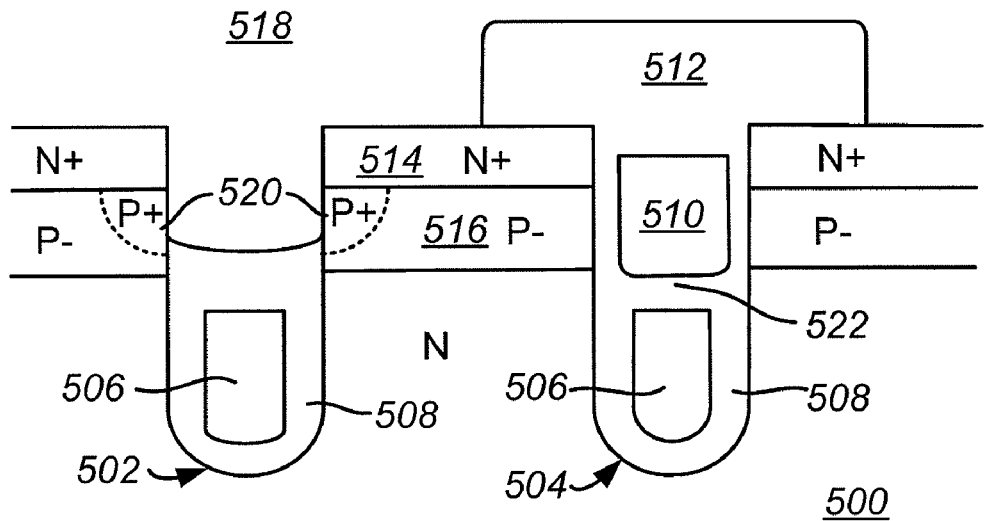
FIG. 9 is a simplified cross section view of a shielded gate FET with a non-gated trench wherein the heavy body regions are formed in the body regions rather than inside the non-gated trench.

FIG. 9 is a simplified cross section view of a shielded gate FET with a non-gated trench wherein the heavy body regions are formed in the body regions rather than inside the non-gated trench. The shielded gate FET structure in FIG. 9 is similar to that in FIG. 7H except that heavy body regions 520 are formed in body regions 516, and the source interconnect layer 518 extends into and fills an upper portion of non-gated trench 502. Source interconnect layer electrically contacts source regions 514 along the mesa surfaces and sidewalls of the source regions, and contacts heavy body regions 520 along their sidewalls, as shown. The remaining structural features of the FET in FIG. 9 are similar to those in FIG. 7H and thus will not be described.

The process flow for forming the FET structure in FIG. 9 is similar to that depicted by FIGS. 7A-7H except for the following changes. In FIG. 7G, after recessing dielectric materials 306 and 310 in non-gated trench 302 whereby sidewalls of body regions 328 are partially exposed, a two-pass angled implant of p-type dopants into exposed sidewalls of non-gated trench 302 is carried out to form heavy body regions 520 (FIG. 9) in the body regions. In one embodiment, no mask is used in carrying out the two-pass angled implant, and the heavy body implant dose is selected to be lower than that for the source regions so that the effective doping concentration of the source regions in the vicinity of the non-gated trench is not impacted by the heavy body implant in any significant way.

Figure 7H:
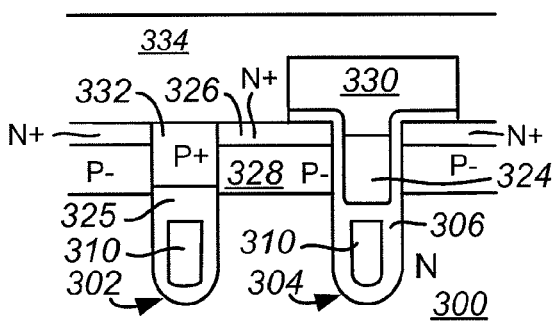

In FIG. 7H, upon depositing the source interconnect layer over the structure, the source interconnect layer fills the non-gated trench thus electrically contacting the heavy body regions and the source regions along their sidewalls as shown in FIG. 9. The embodiment in FIG. 9 has the same features and advantages as the embodiments depicted by FIG. 7H described above. Also, the alternate variations and embodiments of the FIGS. 7A-7H embodiment described above also apply to the FIG. 9 FET structure.

Figure 10:
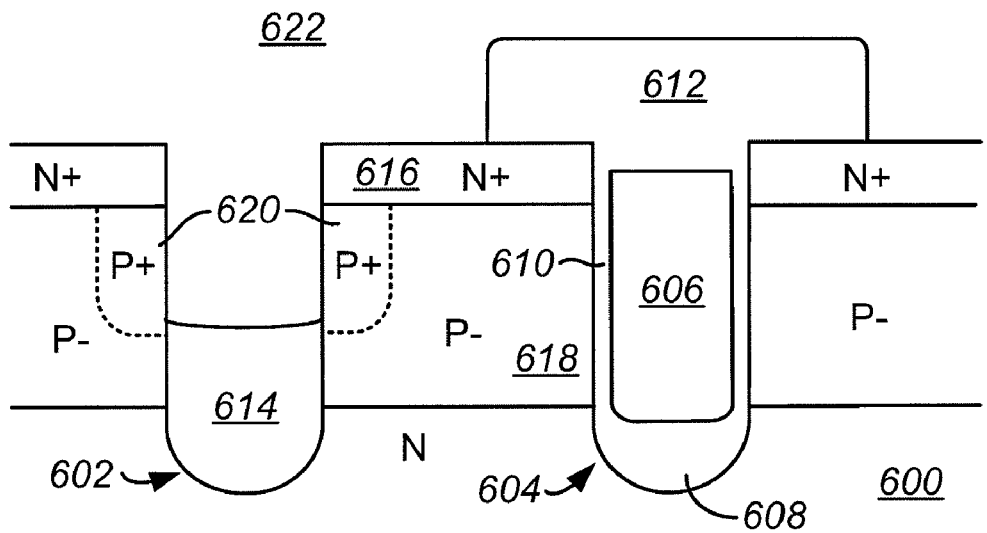
FIG. 10 is a simplified cross section view of a trench gate FET with a non-gated trench wherein the heavy body regions are formed in the body regions rather than inside the non-gated trench.

FIG. 10 is a simplified cross section view of a trench gate FET with a non-gated trench wherein the heavy body regions are formed in the body regions rather than inside the non-gated trench. The trench gate FET structure in FIG. 10 is similar to that in FIG. 6G except that heavy body regions 620 are formed in body regions 618, and the source interconnect layer 622 extends into and fills an upper portion of non-gated trench 602. Source interconnect layer electrically contacts source regions 514 along the mesa surfaces and sidewalls of the source regions, and contacts heavy body regions 520 along their sidewalls, as shown. The remaining structural features of the FET in FIG. 10 are similar to those in FIG. 6G and thus will not be described.

The process flow for forming the FET structure in FIG. 10 is similar to that depicted by FIGS. 6A-6G except for the following changes. In FIG. 6F, after recessing dielectric materials 206 and 210 in non-gated trench 202 whereby sidewalls of body regions 226 are partially exposed, a two-pass angled implant of p-type dopants into exposed sidewalls of non-gated trench 202 is carried out to form heavy body regions 620 (FIG. 10) in the body regions. In one embodiment, no mask is used in carrying out the two-pass angled implant, and the heavy body implant dose is selected to be lower than that for the source regions so that the effective doping concentration of the source regions in the vicinity of the non-gated trench is not impacted by the heavy body implant in any significant way.

In FIG. 6G, upon depositing the source interconnect layer over the structure, the source interconnect layer fills the non-gated trench thus electrically contacting the heavy body regions and the source regions along their sidewalls as shown in FIG. 10. The embodiment in FIG. 10 has the same features and advantages as the embodiments depicted by FIG. 6G described above. Also, the alternate variations and embodiments of the FIGS. 6A-6G embodiment described above also apply to the FIG. 10 FET structure.

The various structures and methods of the present invention may be combined with one or more of a number of charge balance and shielded gate techniques (e.g. those in FIGS. 2A-2B, 3A-3B, 4A-4E, 5B-5C, 6-8, 9A-9C, 10-24, as well as other device structures and manufacturing processes disclosed in the commonly assigned application Ser. No. 11/026,276, filed Dec. 29, 2004, and incorporated herein by reference in its entirety, to achieve an even lower on-resistance, higher blocking capability and higher efficiency, among other advantages and features. Additionally, one or more of the various shielded gate structures (e.g., those in FIGS. 4-7) and methods for forming them disclosed in the above-referenced commonly assigned U.S. patent application Ser. No. 11/441,386, filed on May 24, 2006, can be advantageously combined with one or more of the charge balance techniques (e.g., those in FIGS. 3A-3E, 4, 5A-5B, 7A-7H, 8A-8H, 9-10) disclosed herein to obtain charge balance shielded gate devices with optimized performance and structural characteristics.

The cross-section views of the different embodiments described herein may not be to scale, and as such are not intended to limit the possible variations in the layout design of the corresponding structures.

Although a number of specific embodiments are shown and described above, embodiments of the invention are not limited thereto. For example, while the various embodiments described above are implemented in conventional silicon, these embodiments and their obvious variants can also be implemented in silicon carbide, gallium arsenide, gallium nitride, or other semiconductor materials. As another example, while the above embodiments are described in the context of n-channel transistors, p-channel counterpart transistors can be formed by simply reversing the conductivity type of the various regions. Also, the various transistors described herein can be formed in open or closed cell configurations, including hexagonal, oval or square shaped cells. Further, the embodiments of the present invention are not limited to MOSFETs. For example, the modifications necessary to form IGBT counterparts of the above-described MOSFETs would be obvious to one skilled in this art in view of this disclosure. Additionally, while some of the embodiments described herein are particularly useful for low voltage applications, the process flows and structures described herein may be modified by one skilled in the art in view of this disclosure to form transistors that are more suitable for high voltage applications and have many of the same advantages and features of the present invention. Moreover, the features of one or more embodiments of the invention may be combined with one or more features of other embodiments of the invention without departing from the scope of the invention.

Therefore, the scope of the present invention should be determined not with reference to the above description but should, instead, be determined with reference to the appended claim, along with their full scope of equivalents.

What is claimed is:

1. A FET comprising:
   a plurality of trenches extending into a semiconductor region of a first conductivity type, the plurality of trenches comprising a plurality of gated trenches and a plurality of non-gated trenches;
   a body region of a second conductivity in the semiconductor region between adjacent trenches;
   a dielectric material filling a bottom portion of each of the gated and non-gated trenches;
   a gate electrode in each gated trench; and
   a conductive material of the second conductivity type in each non-gated trench such that the conductive material contacts corresponding body regions along sidewalls of the non-gated trench.

2. The FET of claim 1 further comprising:
   a source region of the first conductivity type in each body region, wherein the conductive material in each non-gated trench contacts corresponding source regions along sidewalls of the non-gated trench; and
   a source interconnect layer contacting each source region and each conductive material.

3. The FET of claim 1 wherein the dielectric material in each non-gated trench has a top surface above a bottom surface of the body region.

4. The FET of claim 2 wherein each source region extends across an entire width of a mesa region bounded along the lateral dimension by two adjacent trenches.

5. The FET of claim 1 wherein the semiconductor region comprises a highly doped substrate and an overlying epitaxial layer, and the body region is formed in an upper portion of the epitaxial layer.

6. The FET of claim 1 wherein the conductive material comprises polysilicon of the second conductivity type.

7. The FET of claim 1 wherein one non-gated trench is arranged between every two adjacent gated trench.

8. The FET of claim 1 wherein two or more non-gated trenches are formed between every two adjacent gated trenches.

* * * * *